United States Patent [19]

Dijkmans

[11] Patent Number: 4,706,066
[45] Date of Patent: Nov. 10, 1987

[54] SWITCH CAPACITOR D/A CONVERTER HAVING A DISTORTION REDUCING CAPACITOR

[75] Inventor: Eise C. Dijkmans, Eindhoven, Netherlands

[73] Assignee: U.S. Philips Corporation, New York, N.Y.

[21] Appl. No.: 793,873

[22] Filed: Nov. 1, 1985

[30] Foreign Application Priority Data

Jul. 2, 1985 [NL] Netherlands ............... 8501896

[51] Int. Cl.$^4$ ............................................. H03M 1/66
[52] U.S. Cl. .......................... 340/347 DA; 324/78 E; 340/347 SH; 340/347 M
[58] Field of Search ............... 340/347 DA, 347 NT, 340/347 M, 347 CC; 324/78 E

[56] References Cited

U.S. PATENT DOCUMENTS 3,541,446 11/1970 Prozeller .................. 340/347 CC
4,009,475 2/1977 DeFreitas ................. 340/347 AD
4,588,983 5/1986 Strong .................... 340/347 NT

OTHER PUBLICATIONS van de Plassche, A Sigma–Delta Modulator as an A/D Converter, IEEE Transactions on Circuits and Systems, vol. CAS-25, No. 7, 7/1978, pp. 510–514.

Primary Examiner—T. J. Sloyan
Attorney, Agent, or Firm—Robert T. Mayer; Bernard Franzblau

[57] ABSTRACT

A D/A converter which converts a one-bit coded signal into an analog signal by means of an integrator comprising an operational amplifier (1) having an output (4) fed back to the inverting input (3) by means of a first capacitor ($C_1$) and a resistor ($R_1$). Depending on the value of the one-bit coded signal a positive current pulse or a negative current pulse is applied to the inverting input (3) of the integrator. The positive current pulses are generated by means of a switching network (10) comprising a second capacitor ($C_3$) which is switched by means of a plurality of switches ($S_1$ to $S_4$). The negative current pulses are generated by means of a switching network (20) comprising a third capacitor ($C_4$) which is switched by a plurality of further switches ($S_5$ to $S_8$). In order to ensure that the analog output signal is not distorted as a result of the positive and negative current pulses, a fourth capacitor ($C_2$) is connected to the inverting input of the integrator. The fourth capacitor has a higher capacitance than each of the other capacitors ($C_1$, $C_3$, $C_4$).

10 Claims, 3 Drawing Figures

SWITCH CAPACITOR D/A CONVERTER HAVING A DISTORTION REDUCING CAPACITOR

BACKGROUND OF THE INVENTION

This invention relates to a digital-to-analog converter for converting a one-bit coded signal into an analog signal and comprising an integrator for integrating current pulses of a first polarity when the coded signal has a first value and for integrating current pulses of a second polarity when the coded signal has a second value.

Such a digital-to-analog converter is described in the article "A Sigma-Delta Modulator as an A/D-converter" in "IEEE Transactions on Circuits and Systems", Vol. CAS-25 No. 7, July 1978, pp. 510–514. This known converter comprises a capacitor which integrates positive or negative current pulses depending on the value ("1" or "0") of the 1-bit coded signal. The voltage across the capacitor constitutes the analog output voltage. The positive and negative current pulses are supplied by a current source and a current sink respectively.

Instead of the capacitor the integrator may, in principle, comprise an operational amplifier having an output connected to the inverting input via a first capacitor. Alternatively, the current pulses may be generated by means of a switched second capacitor. A positive current pulse can be produced by first discharging this capacitor and subsequently charging it by connecting one pole of the capacitor to a reference voltage and the other pole to the inverting input of the amplifier. A negative current pulse can be generated by first charging the capacitor by connecting one pole of the capacitor to the reference voltage and connecting the other pole to ground and subsequently discharging the capacitor by connecting said one pole to ground and the other pole to the inverting input of the amplifier.

However, a digital-to-analog converter employing this circuit arrangement presents the following problem. When the second capacitor is charged to generate a positive current pulse a comparatively large voltage transient is produced at the inverting input of the amplifier because the first capacitor and the second capacitor act as a voltage divider for the reference voltage. Moreover, the charging current of the capacitors, which has a comparatively high initial value, produces another voltage transient across the output resistance of the amplifier. The latter transient also appears at the inverting input and adds to the first-mentioned transient. As a result of the limited bandwidth of the amplifier the output of the amplifier cannot follow this voltage transient at the input. Therefore, despite the negative feedback, the input signal of the amplifier may become so large that the input stage is overdriven. Consequently, the relationship between the input voltage and the output voltage of the amplifier is no longer linear, which gives rise to distortion. This distortion causes intermodulation of the various frequency components of the analog output signal. A similar problem occurs for negative current pulses.

SUMMARY OF THE INVENTION

Therefore, it is an the object of the invention to provide a digital-to-analog converter which can be equipped with switched capacitors without causing distortion of the analog output signal.

A digital-to-analog converter of the type specified in the opening paragraph is characterized in that the integrator comprises an operational amplifier having an inverting input, a non-inverting input which is coupled to a first terminal for applying a first reference voltage, and an output which is coupled to the inverting input at least by means of a first capacitor. The converter further comprises at least a first switching network for generating the current pulses, which network is coupled to the inverting input of the amplifier and comprises a second capacitor. A third capacitor is arranged between the inverting input of the amplifier and the first terminal. The third capacitor has a capacitance which is higher than that of the first capacitor and higher than that of the second capacitor. In the digital-to-analog converter in accordance with the invention the third capacitor ensures that the output signal is not distorted. The input of the amplifier constitutes a low-pass filter whose properties are determined by the third capacitor and the first capacitor, whose capacitance, seen at the input, is increased by a factor equal to the gain factor as a result of the Miller effect. For low frequencies this Miller capacitance is higher than the capacitance of the third capacitor. The cut-off frequency of the filter is then dictated by the first capacitor and the third capacitor does not influence the transfer characteristic of the filter. For high frequencies the Miller capacitance is lower than the capacitance of the third capacitor as a result of the reduced gain. The cut-off frequency of the filter is then dictated by the third capacitor. This cut-off frequency is selected in such a way that high-frequency signals are attenuated. As a result of this, the voltage transients appearing at the inverting input of the amplifier are attenuated. For relatively low input voltages the relationship between the input voltage and the output voltage of the amplifier is linear so that no distortion occurs.

In principle, the current pulses of the first polarity and those of the second polarity can be generated by means of one switching network. However, preferably these current pulses are generated by separate switching networks. The digital-to-analog converter may then be characterized in that the converter comprises a second switching network which is coupled to the inverting input of the amplifier and which comprises a fourth capacitor and in that the first switching network serves for generating current pulses of the first polarity and the second switching network serves for generating current pulses of the second polarity. In a further embodiment the first and the second switching networks may be characterized further in that the first switching network comprises a first switch and a second switch for connecting one pole of the second capacitor to the first terminal and to a second terminal for a second reference potential, respectively, and a third switch and a fourth switch for connecting the other pole of the second capacitor to the first terminal and to the inverting input of the amplifier respectively. Furthermore, the second switching network comprises a fifth switch and a sixth switch for connecting one pole of the fourth capacitor to the first terminal and to the second terminal respectively, and a seventh switch and an eighth switch, for connecting the other pole of the fourth capacitor to the first terminal and to the inverting input of the amplifier, respectively. The switches of the first switching network and the second switching network can be controlled in different ways to generate positive current pulses and negative current pulses. A suitable embodiment of the invention may be characterized in that the converter comprises clock means for closing the first switch, the third switch, the sixth switch and the seventh switch during a first clock period and for closing the second switch and the fifth switch during a second clock period and in that the converter comprises control means controlled by the one-bit coded signal for closing the fourth switch during the second clock period when the coded signal has the first value and for closing the eighth switch during the second clock period when the coded signal has the second value.

BRIEF DESCRIPTION OF THE DRAWINGS

The invention will now be described in more detail, by way of example, with reference to the accompanying drawings, in which.

DESCRIPTION OF THE PREFERRED

Figure 1:
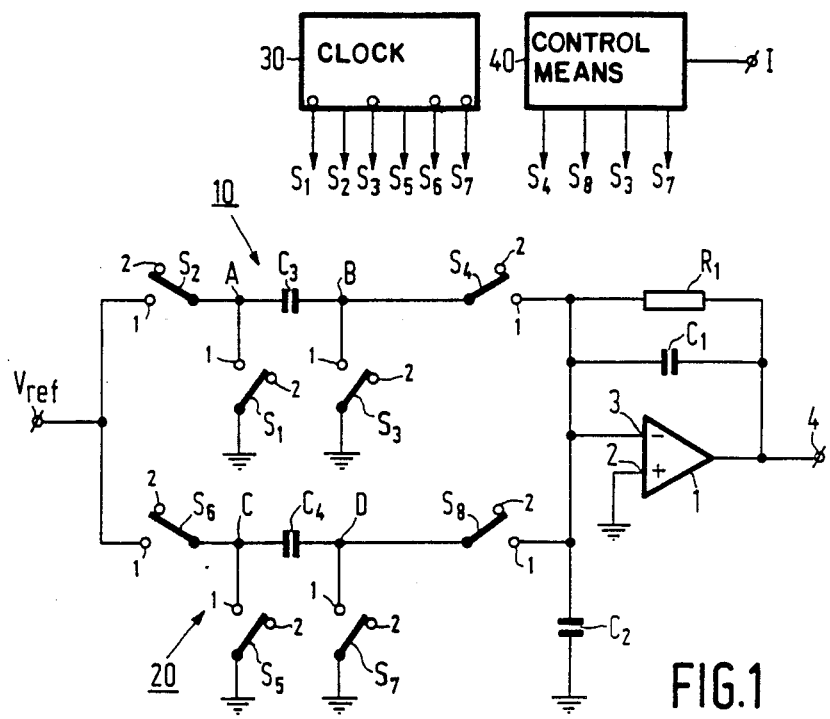
FIG. 1 shows a digital-to-analog converter in accordance with a first embodiment.

FIG. 1 shows a digital-to-analog converter in accordance with a first embodiment of the invention. The converter comprises an operational amplifier 1 having a non-inverting input 2 which is connected to a point of fixed potential, in the present case ground, an inverting input 3, and an output 4. The output 4 is connected to the inverting input 3 by a capacitor $C_1$. The amplifier 1 with the capacitor $C_1$ constitutes an integrator. A resistor $R_1$ is arranged in parallel with the capacitor $C_1$ to provide the d.c. bias. It is to be noted that the resistor $R_1$ may alternatively be a switched capacitance. Further, the inverting input 3 is connected to ground by a capacitor $C_2$. Positive current pulses generated by a first switching network 10 and negative current pulses generated by a second switching network 20 can be applied to the inverting input 3. The switching network 10 comprises a capacitor $C_3$, whose pole A can be connected to a reference voltage $V_{ref}$ by means of a switch $S_2$ and to ground by means of a switch $S_1$. The other pole B can be connected to the inverting input 3 by means of a switch $S_4$ and to ground by means of a switch $S_3$. The switching network 20, comprising a capacitor $C_4$ with poles C and D and comprising switches $S_5$ to $S_8$, may be of the same type as the switching network 10. The switches $S_1$ to $S_8$ may be transistors of any known type and may comprise, for example, p-channel field-effect transistors.

The switches $S_1$, $S_2$, $S_3$, $S_5$, $S_6$ and $S_7$ are controlled by clock means 30, shown schematically. The switches $S_2$ and $S_5$ are controlled by the clock signal CK in such a way that if the clock signal CK is high the switches are in position 1 (closed) and if the clock signal CK is low these switches are in position 2 (open). The switches $S_1$, $S_3$, $S_6$ and $S_7$ are controlled by the clock signal $\overline{CK}$, in such a way that if the clock signal CK is high the switches are in position 2 (open) and if the clock signal CK is low they are in position 1 (closed).

The switches $S_4$, $S_8$, $S_3$ and $S_7$ are controlled by the 1-bit coded input signal I via control means 40, shown schematically. For one bit value, for example a logic 1, the switch $S_4$ is set to position 1 (closed) in the period in which the clock signal CK is high and to position 2 (open) in the periods in which the clock signal CK is low, while the switch $S_8$ is constantly in position 2 (open). For the other bit value, a logic 0, the switch $S_8$ is set to position 1 (closed) in the periods in which the clock signal CK is high and to position 2 (open) in the periods in which the clock signal CK is low, while the switch $S_4$ is constantly in position 2 (open). The same signal as applied to the switch $S_4$ is applied to the switch $S_7$ and the same signal as applied to the switch $S_8$ is applied to the switch $S_3$.

Figure 2:
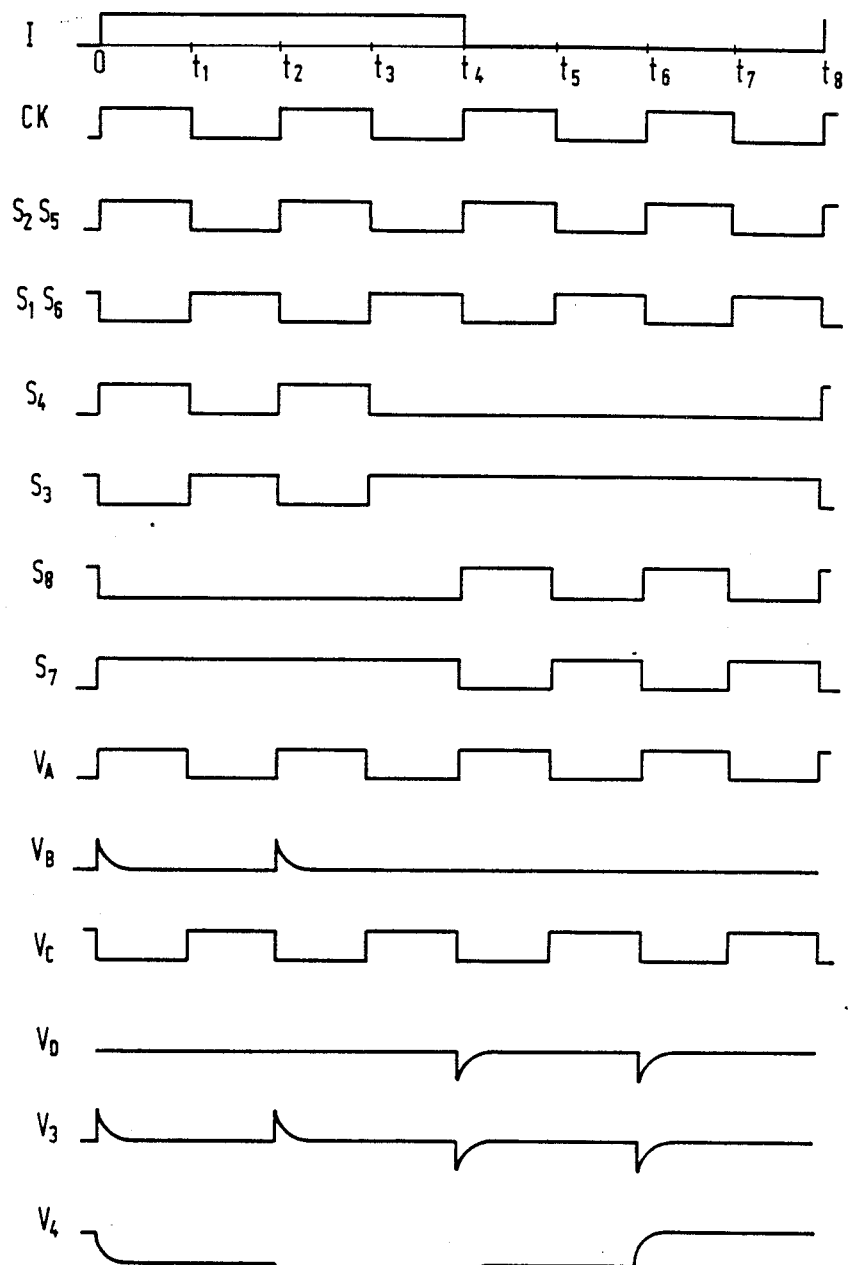
FIG. 2 shows the variation of the voltages at different points in the arrangement of FIG. 1 to explain the operation thereof.

The operation of the circuit arrangement will be described with reference to FIG. 2, which shows the digital input signal I comprising, in this order, two bits of the value "1" and two bits of the value "0", the clock signal CK, the control signals for the switches $S_1$ to $S_8$, the voltage $V_A$ on point A, the voltage $V_B$ on point, the voltage $V_C$ on point C, the voltage $V_D$ on point BD, the voltage $V_3$ on the input 3, and the voltage $V_4$ on the output 4 of the amplifier 1.

In the interval $0-t_2$ the voltage of the input bit I is comparatively high, which corresponds to a logic 1 in the present example. During this interval the switch $S_8$ is open so that the second switching network 20 is disconnected from the inverting input 3 of the amplifier 1. In the clock period $0-t_1$, in which the clock signal CK is high, the switches $S_2$ and $S_4$ are closed. When the switch $S_2$ is closed, point A is connected to the reference voltage $V_{ref}$ so that a positive voltage transient of a magnitude substantially equal to $V_{ref}$ appears at this point. As the capacitor $C_2$ has a high impedance relative to the capacitors $C_1$ and $C_3$, the resulting voltage division ensures that the voltage transient appearing at point B and hence at the inverting input 3 is reduced substantially. This results in a negative voltage transient at the output 4, which transient has a linear relationship with the voltage transient at the input 3 so that no distortion is introduced. The voltage transient at the output 4 gives rise to a current pulse so that the capacitors $C_1$ and $C_3$ are charged and the voltage at the inverting input 3, which is virtually grounded, is pulled back to zero volts. In the clock period $t_1-t_2$, in which the clock signal CK is low, the switches $S_2$ and $S_4$ are open and the switches $S_1$ and $S_3$ are closed. As a result of this, the capacitor $C_3$ is discharged completely so that it can be recharged in the next clock period. In this way a positive current pulse is applied to the amplifier 1.

In the clock period $0-t_1$ the switches $S_5$ and $S_7$ in the second switching network 20 are closed so that the capacitor $C_4$ is discharged fully. In the clock period $t_1-t_2$ the switches $S_6$ and $S_7$ are closed so that the capacitor $C_4$ is charged to the reference voltage $V_{ref}$. In the interval $t_2-t_4$ a logic 1 is again applied to the control means 40, so that a positive current pulse is applied again to the amplifier 1. As a result of this current pulse the output voltage $V_4$ decreases further by the same amount.

In the interval $t_4-t_6$ the voltage of the input bit is comparatively low, which corresponds to a logic "0" in the present example. In this interval the switch $S_4$ is open so that the first switching network is disconnected from the inverting input 3 of the amplifier 1. In the preceding clock period $t_3-t_4$ the capacitor $C_4$ was charged to the reference voltage $V_{ref}$ by means of the switches $S_6$ and $S_7$. In the clock period $t_4-t_5$ the switches $S_5$ and $S_8$ are closed. On point C this results in a negative voltage transient of a magnitude equal to the reference voltage. This gives rise to a negative voltage transient at point D and hence at the inverting input 3, but this transient is attenuated substantially as a result of the presence of the capacitor $C_2$. Consequently, a positive voltage transient appears at the output 4, which transient exhibits a linear relationship with the voltage transient at the input 3 so that no distortion is introduced. The positive voltage transient at the output 4 produces a negative current pulse, so that the capacitance $C_1$ and $C_4$ are discharged and the voltage at the inverting input is restored to zero volts. In the period $t_5-t_6$ the switches $S_6$ and $S_7$ are closed so that the capacitor $C_4$ is again charged to the reference voltage $V_{ref}$.

In the clock period $t_4-t_5$ the switches $S_2$ and $S_3$ in the switching network 10 are closed so that the capacitor $C_3$ is charged to the reference voltage $V_{ref}$. In the next clock period $t_5-t_6$ the switches $S_1$ and $S_3$ are closed so that the capacitor $C_3$ is fully discharged.

In the interval $t_6-t_8$ a logic 0 is again applied to the control means 40 so that again a negative current pulse is applied to the inverting input 3 of the amplifier. As a result of this, the output voltage $V_4$ increases to zero volts.

Thus, in the manner described above, the consecutive input bits determine whether a current pulse is applied to or supplied by the capacitor $C_1$ and consequently whether the analog output voltage decreases or increases.

It is to be noted that in principle it is also possible to control the switches $S_2$ and $S_6$ by switching pulses derived from the digital input signal and to control the switches $S_4$ and $S_8$ by the clock signal. However, this has the following drawback. The consecutive switching pulses by means of which the switch $S_2$ is then switched over contain low-frequency signal information, so that the voltage at point A will contain low-frequency components. These low-frequency signals may reach the inverting input 3 of the amplifier via the stray capacitances of the switches and thus give rise to distortion of the output signal. If the switch $S_4$ is controlled by switching pulses derived from the digital input signal, these low-frequency signals also appear at the inverting input 3 of the amplifier 1, but in this case the voltage level is very low because this input constitutes a virtual ground and stray capacitances have no effect at this point.

Figure 3:
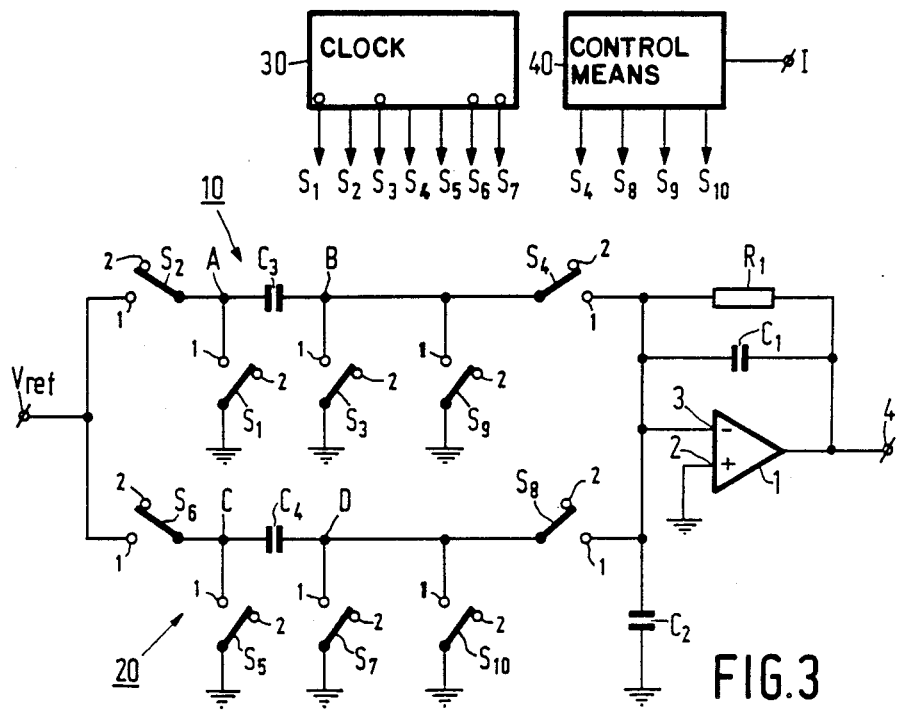
FIG. 3 shows a digital-to-analog converter in accordance with a second embodiment.

FIG. 3 shows a digital-to-analog converter in accordance with a second embodiment of the invention, and in this Figure identical parts bear the same reference numerals as in FIG. 1. The converter differs from that shown in FIG. 1 in that in the switching network 10 a switch $S_9$ is arranged in parallel with the switch $S_3$ and in the switching network 20 a switch $S_{10}$ is arranged in parallel with the switch $S_7$. The switches $S_9$ and $S_{10}$ are controlled by switching pulses which are derived from the digital input signal I by the control means 40 in such a way that the switch $S_9$ is switched in the same way as the switch $S_8$ and the switch $S_{10}$ is switched in the same way as the switch $S_4$.

In the embodiment shown in FIG. 1 the switches $S_3$ and $S_7$ receive both clock pulses and switching pulses derived from the digital input signal. As a result of this, the switch $S_7$ remains closed in the case of consecutive bits of the value "1" and the switch $S_3$ remains closed in the case of consecutive bits of the value "0" (see FIG. 2). This may give rise to lowfrequency signals at points B and D caused by the discharge of stray capacitances, which signals give rise to distortion of the output signal. In the embodiment shown in FIG. 3 the switches $S_3$ and $S_7$ are switched by the clock pulses only, while the switching pulses derived from the digital input signal are applied to separate switches $S_9$ and $S_{10}$. As a result of this, at least one of the switches $S_3$ and $S_9$ in the switching network 10 and at least one of the switches $S_7$ and $S_{10}$ in the switching network 20 is switched over after every clock period. This precludes the occurrence of low-frequency signals at points B and D, which may give rise to distortion of the output signal.

The scope of the invention is not limited to the embodiments shown. For example, as an alternative the positive current pulses and the negative current pulses may, in principle, be generated by means of one switching network, in which case the steps which are performed simultaneously by the two switching networks should be performed after each other. In the present embodiment the non-inverting input 2 of the amplifier 1 and the switches connected thereto are connected to ground. However, they may instead be connected to a point of non-zero potential. In the present embodiments the transistor switches are all of the same conductivity type. However, the switches to which the inverted clock signal is applied may be of the opposite conductivity type, which enables all the switches to be controlled by means of the same clock signal. In the present embodiments the charge and discharge times of the capacitors $C_3$ and $C_4$ are selected to be equal to each other. However, alternatively the discharge time may differ from the charge time.

What is claimed is:

1. A digital-to-analog converter for converting a one-bit coded signal into an analog signal, comprising: an integrator for integrating current pulses of a first polarity when the coded signal has a first value and for integrating current pulses of a second polarity when the coded signal has a second value, wherein the integrator comprises an operational amplifier having an inverting input, a non-inverting input coupled to a first terminal for applying a first reference voltage, and an output coupled to the inverting input at least by means of a first capacitor, a switching network controlled by said coded signal for generating the first and second polarity current pulses, said switching network being coupled to the inverting input of the amplifier and comprising a second capacitor, and a third capacitor coupled between the inverting input of the amplifier and the first terminal, said third capacitor having a capacitance which is higher than that of the first capacitor and higher than that of the second capacitor.

2. A digital-to-analog converter as claimed in claim 1 which comprises a second switching network controlled by said coded signal and coupled to the inverting input of the amplifier and which comprises a fourth capacitor, and wherein the first switching network generates current pulses of the first polarity and the second switching network generates current pulses of the second polarity.

3. A digital-to-analog converter as claimed in claim 2, characterized in that the first switching network comprises a first switch and a second switch for connecting one pole of the second capacitor to the first terminal and to a second terminal for a second reference potential, respectively, and a third switch and a fourth switch for connecting the other pole of the second capacitor to the first terminal and to the inverting input of the amplifier, respectively, and the second switching network comprises a fifth switch and a sixth switch for connecting one pole of the fourth capacitor to the first terminal and the second terminal respectively, and a seventh switch and an eighth switch for connecting the other pole of the fourth capacitor to the first terminal and to the inverting input of the amplifier respectively.

4. A digital-to-analog converter as claimed in claim 3, characterized in that the converter comprises clock means for closing the first switch, the third switch, the sixth switch and the seventh switch during a first clock period and for closing the second and the fifth switch during a second clock period and control means controlled by the one-bit coded signal for closing the fourth switch during the second clock period when the coded signal has the first value and for closing the eighth switch during the second clock period when the coded signal has the second value.

5. A digital-to-analog converter as claimed in claim 4, characterized in that the converter comprises a ninth switch connected in parallel with the third switch, and a tenth switch, connected in parallel with the seventh switch, wherein the ninth switch and tenth switch are controlled by the control means in the same way as the eighth switch and the fourth switch, respectively.

6. A D/A converter for converting a digital signal into an analog signal comprising: an integrator comprising an operational amplifier having a non-inverting input coupled to a first reference voltage terminal, an inverting input coupled to an output of a switching network, and a first capacitor coupling an output of the operational amplifier to its inverting input, a second reference voltage terminal coupled to the switching network, said switching network comprising a second capacitor and a plurality of selectively operable controlled switching devices, control means responsive to the digital signal for operating the switching devices so as to supply current pulses of a first and second polarity to the inverting input of the operational amplifier in dependence on the digital signal whereby the integrator integrates said current pulses, and a third capacitor coupled between the inverting input of the operational amplifier and the first reference voltage terminal, said third capacitor having a capacitance value greater than the capacitance value of the first capacitor and of the second capacitor.

7. A D/A converter as claimed in claim 6 further comprising a second switching network coupling the second reference voltage terminal to the inverting input of the operational amplifier and having a fourth capacitor and a plurality of controlled switching devices controlled by the control means in dependence on the digital signal, whereby the first and second switching networks supply said current pulses of the first polarity and the second polarity, respectively, to the inverting input of the operational amplifier.

8. A D/A converter as claimed in claim 7 wherein the second and fourth capacitors each have first and second electrodes, the first switching network comprises first and second switching devices for selectively connecting the first electrode of the second capacitor to said first and second reference voltage terminals, respectively, and third and fourth switching devices for selectively connecting the second electrode of the second capacitor to the first reference voltage terminal and to the inverting input of the operational amplifier, respectively, and wherein the second switching network comprises fifth and sixth switching devices for selectively connecting the first electrode of the fourth capacitor to the first and second reference voltage terminals, respectively, and seventh and eighth switching devices for selectively connecting the second electrode of the fourth capacitor to the first reference voltage terminal and to the inverting input of the operational amplifier, respectively.

9. A D/A converter as claimed in claim 8 wherein the control means operates the first, third, sixth and seventh devices simultaneously during a first time period and simultaneously operates the second and fifth switching devices during a second time period, and wherein the control means selectively operates the fourth and eighth switching devices so that the first and second switching networks supply the respective first and second polarity current pulses to the integrator during different time periods.

10. A D/A converter as claimed in claim 9 wherein the control means comprises a source of clock pulses for selectively operating the first through the third and the fifth through the seventh switching devices in the sequence set forth in claim 9.

* * * * *